United States Patent [19]
Kamitani

[11] Patent Number: 5,493,707
[45] Date of Patent: Feb. 20, 1996

[54] BURST TRANSMISSION APPARATUS WITH POWER AMPLIFYING BOOSTER AND METHOD OF BOOSTING BURST TRANSMISSION SIGNALS

[75] Inventor: Toshiki Kamitani, Amagasaki, Japan

[73] Assignee: Mitsubishi Denki Kabushiki Kaisha, Tokyo, Japan

[21] Appl. No.: 275,726

[22] Filed: Jul. 19, 1994

[30] Foreign Application Priority Data

Jul. 23, 1993 [JP] Japan .................................. 5-182417

[51] Int. Cl.⁶ .............................. H04B 1/04; H04B 1/16
[52] U.S. Cl. .............................................. 455/127; 455/89
[58] Field of Search ............................ 455/89, 126, 127, 455/115, 117; 330/136, 279

[56] References Cited

U.S. PATENT DOCUMENTS 5,048,117  9/1991  Aisaka et al. ................... 455/127 X
5,193,223  3/1993  Walczak et al. ................. 455/127 X
5,369,789  11/1994  Kosugi et al. ..................... 455/126

FOREIGN PATENT DOCUMENTS 0331435  9/1989  European Pat. Off. .
0537690  4/1993  European Pat. Off. .
0556010  8/1993  European Pat. Off. .
0574189  12/1993  European Pat. Off. .
0599659  6/1994  European Pat. Off. .
2268022  11/1990  Japan .
 376430  4/1991  Japan .
9204771  3/1992  WIPO .

*Primary Examiner*—Chi H. Pham
*Attorney, Agent, or Firm*—Rothwell, Figg, Ernst & Kurz

[57] ABSTRACT

A burst transmission booster and a burst transmission apparatus using the burst transmission booster. A low-power transmitter is responsive to a command from a base station to power-amplify and output transmission signals. If the commanded power level is too high to be realized solely by the low-power transmitter, the output of the low-power transmitter is boosted by the booster. The booster executes the boost such that the power level and waveform of the transmission signal will be coincident with or substantially coincident with the level and waveform of a given reference burst wave.

16 Claims, 7 Drawing Sheets

BURST TRANSMISSION APPARATUS WITH POWER AMPLIFYING BOOSTER AND METHOD OF BOOSTING BURST TRANSMISSION SIGNALS

BACKGROUND OF THE INVENTION a) Field of the Invention

The present invention relates to a booster and method for boosting the output of a low-power burst transmitter and also to a burst transmission apparatus using such a booster.

b) Description of the Prior Art

When using a low-power transmitter, it is preferred to provide a booster on the output side of the transmitter. More particularly, a low-power transmitter having its output insufficient to provide the required output must be boosted up to that required output. If the low-power transmitter is of a continuous transmission type, its transmission output may be boosted according to such a principle as described in U.S. Ser. No. 07/455156 filed on Dec. 22, 1989 or Japanese Patent Laid-Open No. Hei 3-76430.

FIG. 6A shows a continuous transmission apparatus comprising a low-power transmitter 100 and a booster 200 connected to the later part of the transmitter. The low-power transmitter 100 comprises a power amplifier (PA) 110, an automatic power controller (APC) 120 and a control circuit 130. The booster 200 comprises a PA 210 and an APC 220.

The PA 110 of the low-power transmitter 100 receives a transmission signal through a transmission signal input terminal 100a and then power-amplifies the transmission signal. The amplified transmission signal is outputted from an antenna connection terminal 140. If the use of the booster 200 is not required, that is, if the output transmission level of the low-power transmitter 100 satisfies the required level, the antenna connection terminal 140 is connected to an antenna to transmit the output of the PA 110 out of the antenna. However, if there is a possibility potential of not satisfy the required transmission output level in the low-power transmitter 100, the antenna connection terminal 140 is then connected to a transmission signal input terminal 250 of the booster 200 as shown. In such a connection, a transmission signal outputted from the antenna connection terminal 140 is received by the PA 210 of the booster 200 through the transmission signal input terminal 250. The PA 210 then power-amplifies this transmission signal. The amplified transmission signal is fed from an antenna connection terminal 270 to an antenna (not shown).

The power amplification of the PA 110 or 210 is controlled directly by the APC 120 or 220. More particularly, each of the APC 120 or 220 is adapted to sense the output power level of the corresponding PA 110 or 210 to feedback control the amplification factor of the PA 110 or 210 on the sensed level. Thus, the output power level of the PA 110 or 210 can be controlled into a target level. The target level is provided by the control circuit 130.

The control circuit 130 receives and responds to a command relating to the necessary power level from a base station (not shown) to provide the target value to the respective one of the APCs 120 and 220. These target values are allocated to the APCs 120 and 220 so that the output power level of the PA 210 will be the power level commanded by the base station. Reference numerals 150 and 260 in FIG. 6A denote control signal output and input terminals, respectively. When the booster 200 is used, the control signal output and input terminals are connected to each other. When the booster 200 is not used, the control signal output and input terminals are disconnected from each other and the control circuit 130 provides a target value to the APC 120 such that the power level commanded by the base station can be realized only by the PA 110.

In such a prior art system, therefore, the output power levels of the PAs 110 and 210 are continuously and constantly controlled by the APCs 120 and 220. Since the target values relating to such a control are suitably given depending on the commanded power level from the control circuit 130, the output of the low-power transmitter 100 can be boosted up to the commanded power level.

However, the boost based on such a principle can be applied only to the continuous transmission type low-power transmitter 100, but not to a burst transmission. The continuous transmission is that signals are continuously sent out time, as shown in FIG. 7A. The burst transmission is that a station can send out signals only within a time slot assigned to itself, as shown in FIG. 7B. The burst transmission is executed by a TDMA (Time Division Multiple Access) communication system.

The reasons why the boost principle shown in FIGS. 6A and 6B cannot be applied to the burst transmission are that the output power level of the PA 210 is continuously and constantly controlled and also that the burst transmission permits transmission signals to be outputted only within a time slot assigned to each of local stations.

It is now assumed that the boost principle shown in FIGS. 6A and 6B is applied to the burst transmission. Namely, assume that transmission signals inputted into the booster 200 are burst signals for carrying data only within a time slot assigned to the respective one of local stations. What is inherently required by the burst transmission is the output of transmission signals only within an assigned time slot. When the output power level of the PA 210 as shown in FIGS. 6A and 6B is continuously and constantly controlled, however, transmission signals will unintentionally be outputted within a time slot not assigned to that station. This means that the boost principle shown in FIGS. 6A and 6B cannot be applied to the burst transmission.

SUMMARY OF THE INVENTION

A first object of the present invention is to realize a booster and boosting method suitable for the burst transmission.

A second object of the present invention is to provide a compact burst transmission booster and burst transmission apparatus.

In the first aspect of the present invention, it provides a burst transmission apparatus comprising:

a) a low-power transmitter responsive to a power level command for power-amplifying and outputting transmission signals; and b) a booster for further power-amplifying the transmission signals power-amplified by the low-power transmitter such that the power level and waveform of the transmission signals are coincident with or substantially coincident with those of a given reference burst wave, said booster being connectable with the low-power transmitter if necessary.

According to the present invention, the output of the low-power transmitter is further power-amplified by the booster, if necessary. At that time, not only the power level of the transmission signals but also the waveform (boost waveform) thereof are controlled into targets. As a result, the power level and waveform of the transmission signals are controlled to be coincident with or substantially coincident with those of a given reference (target) burst wave. According to the present invention, therefore, a boost controllable system can be provided which is suitable for the burst transmission.

In the second aspect of the present invention, it provides a booster comprising:

a) a power amplifier for power-amplifying transmission signals from a low-power transmitter;

b) power amplification control means for controlling the power amplification of the power amplifier such that the power level and waveform of the transmission signals power-amplified by the power amplifier are coincident with or substantially coincident with those of a given reference burst wave; and c) burst control means responsive to control information from any external means for determining and providing the reference burst wave to the power amplification control means.

According to the present invention, thus, the boost control resulting from the reference burst wave is executed on the control information from the external means to the booster. The control information may be provided by the low-power transmitter. If such a type of control information is provided from the low-power transmitter to the booster, for example, only a command relating to the power level may be provided from the base station to the low-power transmitter. In such a case, the control circuit within the low-power transmitter will provide the necessary control information to the power amplification control means of the low-power transmitter itself or the burst control means in the booster.

The control information supplied to the booster may include:

a) Information relating to the target power level;

b) Information relating to the timing of generating the burst wave; and c) Information relating to the leading and trailing edge waveforms of the burst wave.

If all the information is supplied to the booster, the burst control means generates a reference burst wave such that the power level of the transmission signals power-amplified by the power amplifier will be the target power level; the transmission signals power-amplified by the power amplifier will rise and fall at a timing in synchronism with the burst wave generation timing; and the leading and trailing edge waveforms of the power level of the transmission signals power-amplified by the power amplifier will be the aforementioned leading and trailing edge waveforms.

However, all the control information is not necessarily required to be provided to the booster. For example, the burst control means may include a storage means which has previously stored a correspondence between a target power level and a reference burst waveform. If the storage means is referred to in connection with the target power level supplied as the control information, the information relating to the reference burst waveform will be provided. This information contains the information relating to the leading and trailing edge waveforms of the burst wave. Therefore, at least the information relating to the leading and trailing edge waveforms of the burst wave may not be provided to the booster. The information relating to the burst wave generation timing may be provided, for example, by an enable signal. According to the present invention, therefore, the wiring between the low-power transmitter and the booster can be omitted or simplified to compact the burst transmission booster and burst transmission system.

To execute the burst transmission by the boosted transmission signals, at least the final stage power amplifier may be controlled only by the reference burst wave. The low-power transmitter is not necessarily required to be subjected to the power amplification control by the reference burst wave at all times, but may be subjected to the power amplification control for continuous transmission when the booster is being used. However, the low-power transmitter must be subjected to the power amplification control on the reference burst wave at least when the booster is not used.

In the third aspect of the present invention, it provides a boosting method comprising:

a) a first step of determining a reference burst wave based on external control information; and b) a second step of power-amplifying transmission signals from a low-power transmitter such that the power level and waveform of the power-amplified transmission signals will be coincident with or substantially coincident with those of the determined reference burst wave.

DETAILED DESCRIPTION OF THE PREFERRED EMBODIMENTS

Some preferred embodiments of the present invention will now be described with reference to the drawings.

a) First Embodiment

Figure 1A:
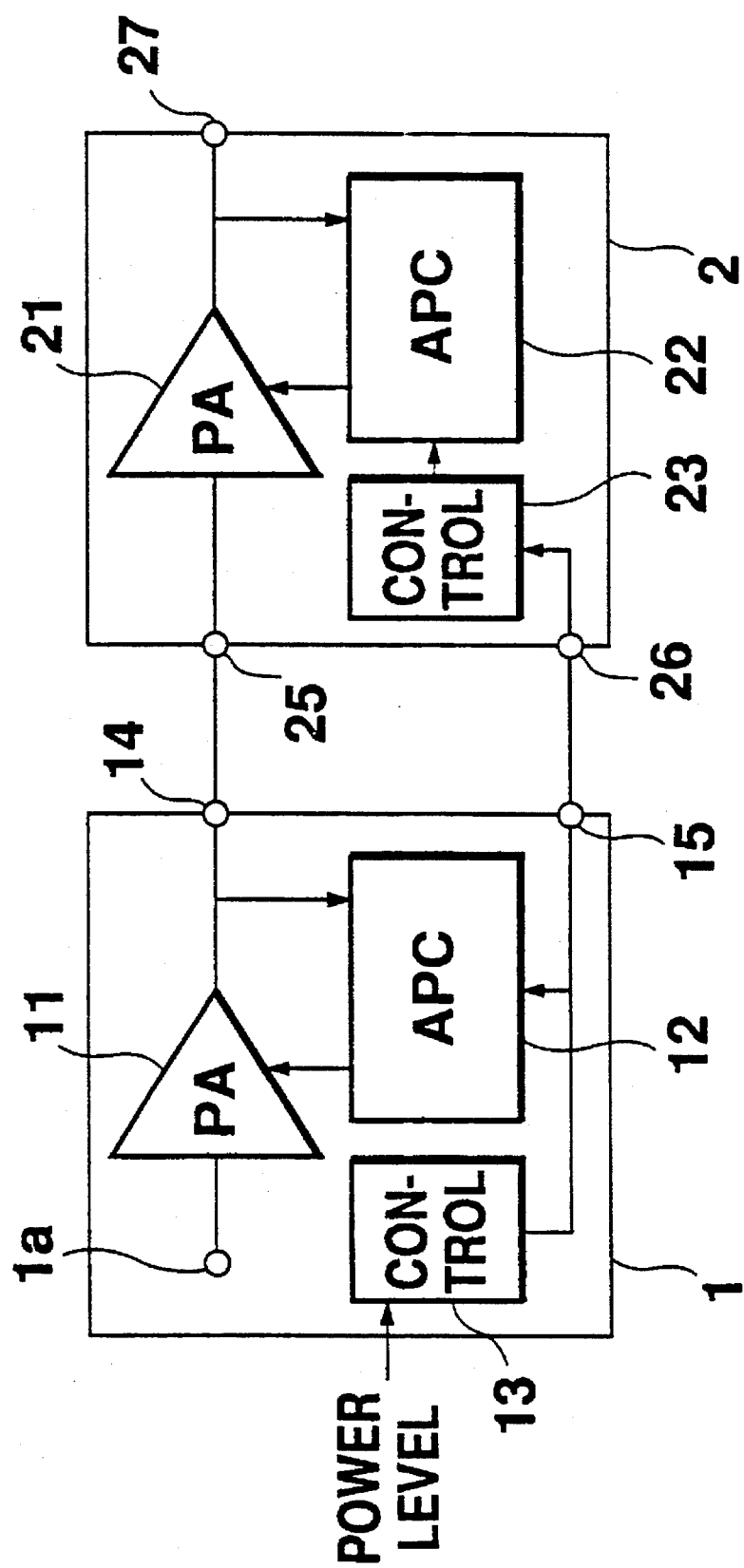
FIG. 1A is a block diagram of the functional layout of a burst transmission apparatus relating to a first embodiment of the present invention.

FIG. 1A shows the layout of a burst transmission apparatus relating to the first embodiment of the present invention. The burst transmission apparatus comprises a low-power transmitter 1 and a booster 2 connected to the later stage of the low-power transmitter 1. The low-power transmitter 1 comprises a PA 11, an APC 12 and a control circuit 13. The booster 2 comprises a PA 21, an APC 22 and a control circuit 23. The low-power transmitter 1 also comprises an antenna connection terminal 14 connected to a transmission signal input terminal 25 in the booster 2 and a control signal output terminal 15 connected to a control signal input terminal 26 in the booster 2. The booster 2 also comprises an antenna connection terminal connected to an antenna (not shown). When the booster 2 is not used, the antenna connection terminal 14 of the low-power transmitter 1 is connected to the antenna.

The PA 11 of the low-power transmitter 1 receives transmission signals through its transmission signal input terminal 1a and then power-amplifies the received transmission signals. The power-amplified transmission signals are outputted from the antenna connection terminal 14. If it is not required to use the booster 2, the antenna connection terminal 14 is connected to the antenna so that the output of the PA 11 will be sent out from the antenna. If there is a possibility that the transmission output level will not satisfy the requirement, the antenna connection terminal 14 is connected to the transmission signal input terminal 25 of the booster 2, as shown in FIG. 1A. In such a connection, the transmission signals outputted from the antenna connection terminal 14 are inputted into the PA 21 of the booster 2 through the transmission signal input terminal 25. The PA 21 then power-amplifies the transmission signals. The power-amplified transmission signals are then sent from the antenna connection terminal 27 to the antenna.

The power amplification of the PAs 11 and 21 are controlled directly by the APCs 12 and 22, respectively. More particularly, each of the APCs 12 and 22 senses the output power level of the corresponding one of the PAs 11 and 21 to feedback control the amplification factor thereof on the sensed output power level in the stepwise manner. Thus, the output power level of the PA 11 and 21 can be controlled into target values. Each of the target values is provided by the control circuit 13 or 23.

The control circuit 13 responds to a command relating to the necessary power from the base station (not shown) and provide control information to the APC 12. The control information contains a) a transmission timing (a time slot assigned to the transmission apparatus); b) a target output power level of the PA 11 to be controlled; and c) information of leading and trailing edge controls. Such a control of the APC 12 using the control information is so that the low-power transmitter 1 according to this embodiment can solely execute a burst transmission even when the booster 2 is not used.

Figure 2:
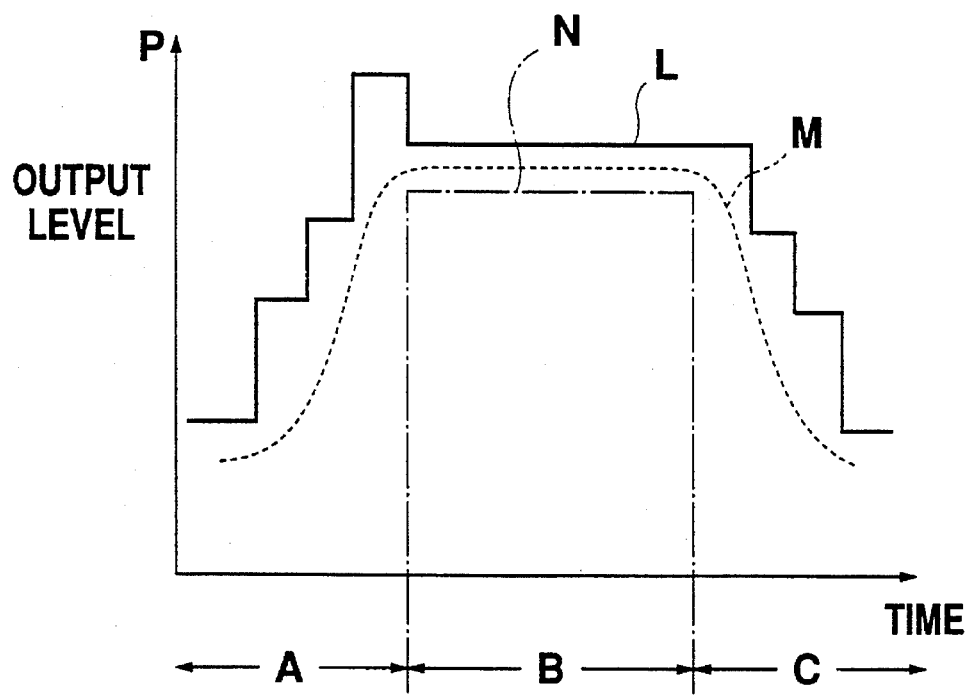
FIG. 2 a graph showing the contents of the APC in the first embodiment of FIG. 1A.

It is now assumed that a time slot assigned to the transmission apparatus is shown by B in FIG. 2. In such a case, the burst transmission can be conveniently realized solely by the low-power transmitter 1 or in co-operation of the low-power transmitter 1 with the booster 2 only when the output power level of the PA 11 is constantly controlled in a window shown by one-dot chain line N in FIG. 2. For such a purpose, the APC 12 must know its time slot timing assigned to the transmission apparatus concerned and also into what value the output power level of the PA 11 should be controlled in the window N. To this end, the control circuit 13 provides a transmission timing and a target output power level to be controlled to the APC 12.

In a period A immediately before the window N, the output power level of the PA 11 must smoothly rise up to a target value and be maintained constant in the window N show by broken line M. In a period C immediately after the window N, the output power level of the PA 11 should smoothly and rapidly fall from the target value as shown by broken line M. To this end, the APC 12 must know what curve the output power level of the PA 11 rises or falls along. Thus, the control circuit 13 provides the information of leading and trailing edge controls to the APC 12.

Based on these three types of information, the APC 12 stepwise controls the output power level of the PA 11. Thus, the output power level of the PA 11 will be varied along the target curve M as shown by solid line L in FIG. 2.

The control circuit 13 also provides the same information to the control circuit 23. The control circuit 23 then converts the control digital information into analog information which is in turn used to generate a reference burst wave shown by the broken line M in FIG. 2. The reference burst wave is then provided to the APC 22. The APC 22 is responsive to it for controlling the output of the PA 21.

Figure 1B:
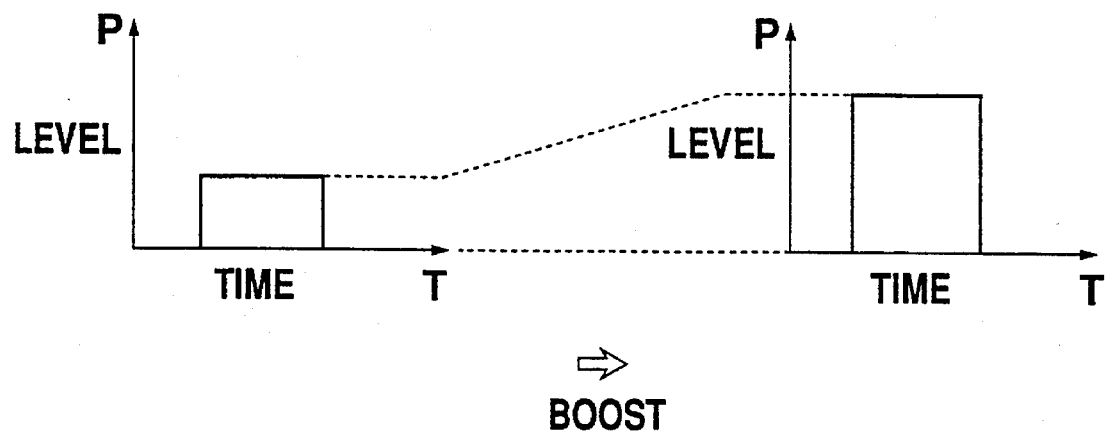
FIG. 1B is a level comparison showing the boost effect in the first embodiment shown in FIG. 1A.

As a result, a burst signal boosted up to the commanded power level can be provided as a high-power transmission signal, as shown in FIG. 1B. Even when the booster 2 is not used, therefore, a preferred burst waveform can be provided.

b) Second Embodiment

Figure 3:
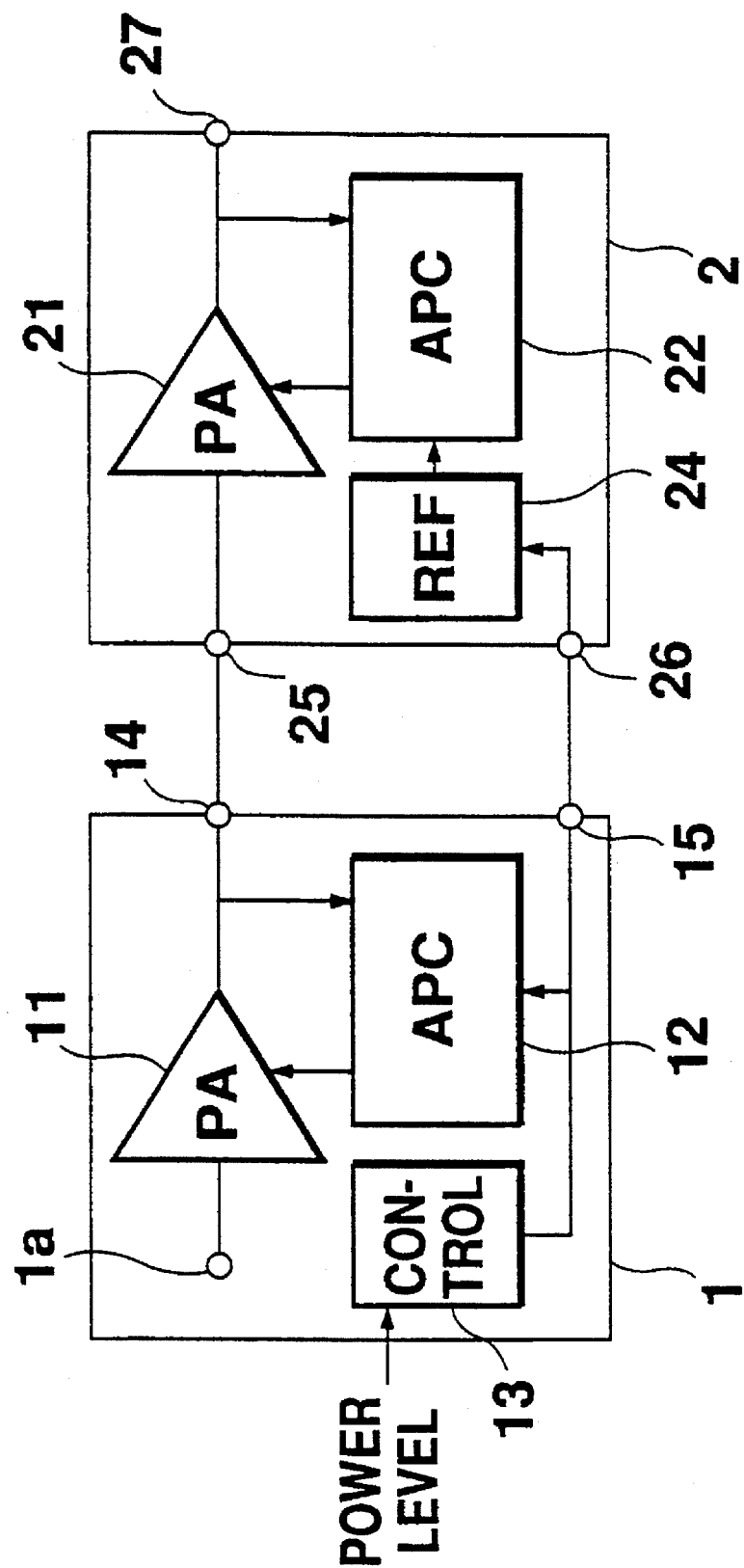
FIG. 3 is a block diagram of the functional layout of a burst transmission apparatus relating to a second embodiment of the present invention.

Referring now to FIG. 3, there is shown a burst transmission system relating to the second embodiment of the present invention in which parts similar to those of the first embodiment are designated by similar reference numerals and will not further be described.

Figure 4A:
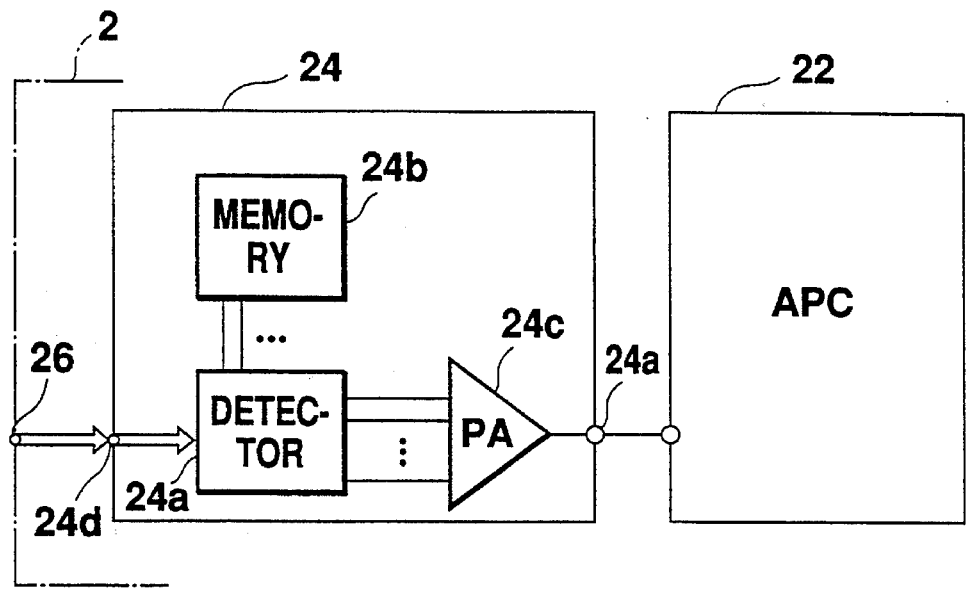
FIG. 4A is a block diagram of the layout of the burst waveform reference voltage generator in the second embodiment of FIG. 3.

The second embodiment uses a reference burst waveform generator 24 in place of the control circuit 23. As shown in FIG. 4A, the reference burst waveform generator 24 comprises a detecting circuit 24a, a memory 24b and a D/A converter 24c.

In the second embodiment, various types of information outputted from the control circuit 13 are provided to the APC 12 and reference burst waveform generator 24. The APC 12 is controlled in the same manner as in the first embodiment. The second embodiment is characterized by that the control device 23 is replaced by the reference burst waveform generator 24 to reduce the number of wirings between the control signal output terminal 15 and a control signal input terminal 26.

The control circuit 13 provides control information to the reference burst waveform generator 24 by using three types of serial signal lines, that is, a data signal line, a clock signal line and an enable signal line. The control information supplied through the data signal line is one indicative of a target output power level in the PA 21. The clock signal line transmits a clock for providing a sampling timing of control information supplied through the data signal line. The enable signal line transmits an enable signal for providing a start timing of a leading edge in the output power level of the PA 21.

Figure 4B:
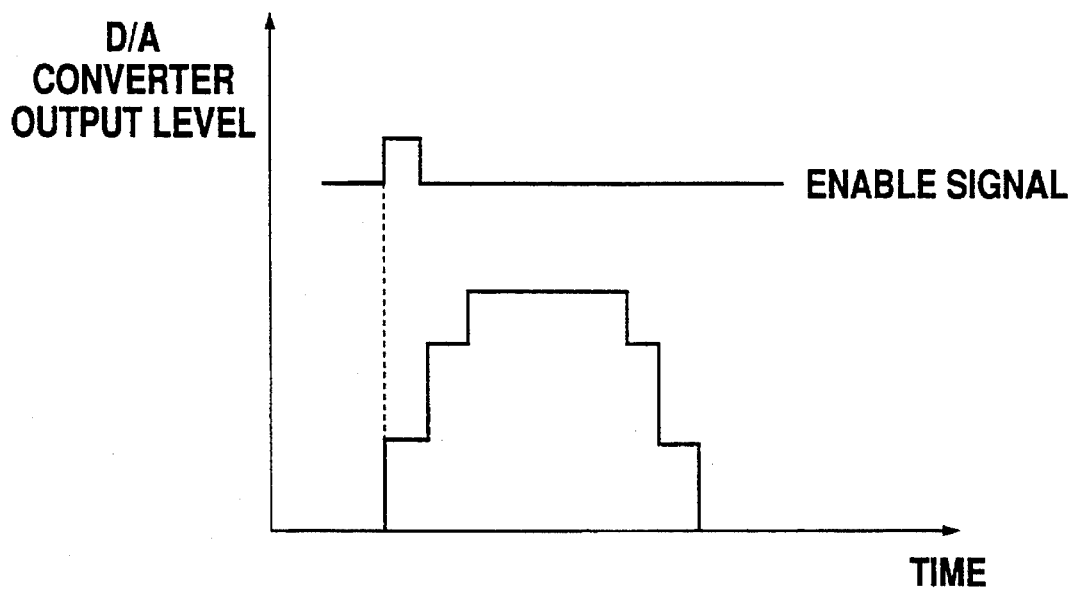
FIG. 4B is a timing chart illustrating the operation of the reference burst waveform generator in the second embodiment of FIG. 3.

The detecting circuit 24a receives the control information, clock and enable signals through the control signal input terminal 24d. The detecting circuit 24a samples the control information supplied through the data signal line in synchronism with the clock supplied through the clock signal line. As shown in FIG. 4B, the sensor circuit 24a reads a reference burst waveform corresponding to the sampled control information out of the memory 24b in synchronism with the enable signal supplied through the enable signal line. The memory 24b may be a ROM which has stored the target output power level of the PA 21 and the reference burst waveform (corresponding to M in FIG. 2), which are correlated with each other. The reference burst waveform read out from the memory 24 is converted into an analog form by the D/A converter 24c and then supplied to the APC 22. The APC 22 is responsive to this reference burst waveform for controlling the output of the PA 21.

According to the second embodiment, therefore, the transmission of the control information from the control circuit 13 to the booster can be carried out in a more simplified manner, resulting in the reduced number of signal lines and the compacted arrangement and also improving the responsibility of the booster 2. Thus, the present invention can provide a high-power burst transmission system which can more easily be used.

c) Third Embodiment

Figure 5:
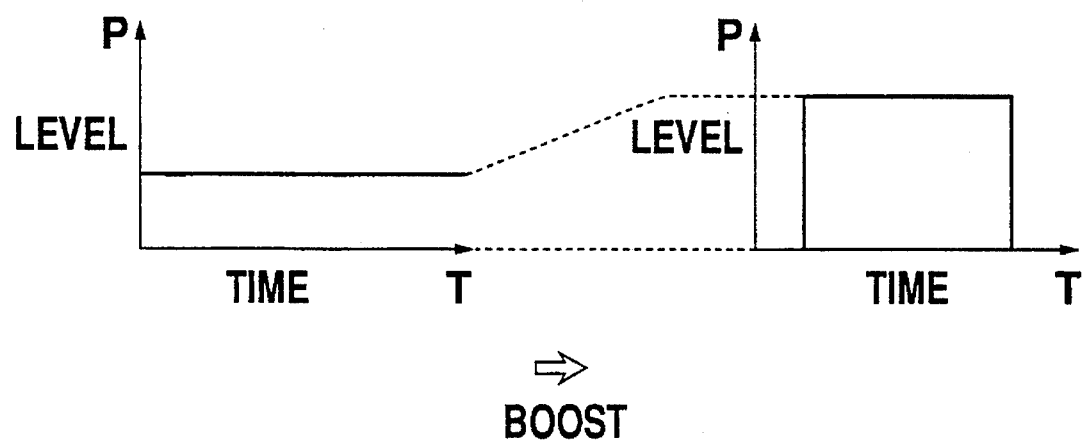
FIG. 5 is a graph illustrating the contents of the APC in a burst transmission apparatus relating to a third embodiment of the present invention.
Figure 6A:
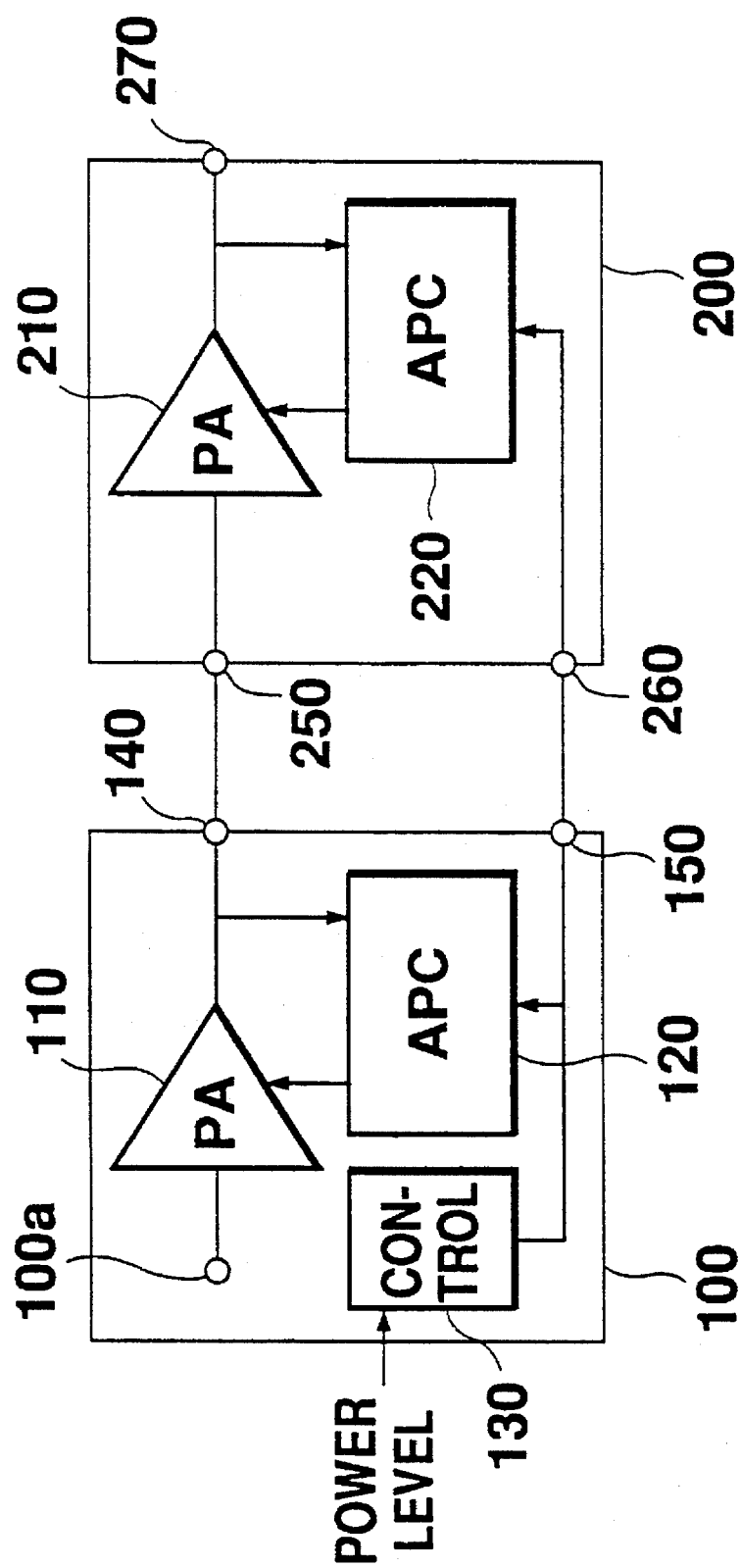
FIG. 6A is a block diagram showing the layout of a continuous transmission apparatus relating to the prior art.
Figure 6B:
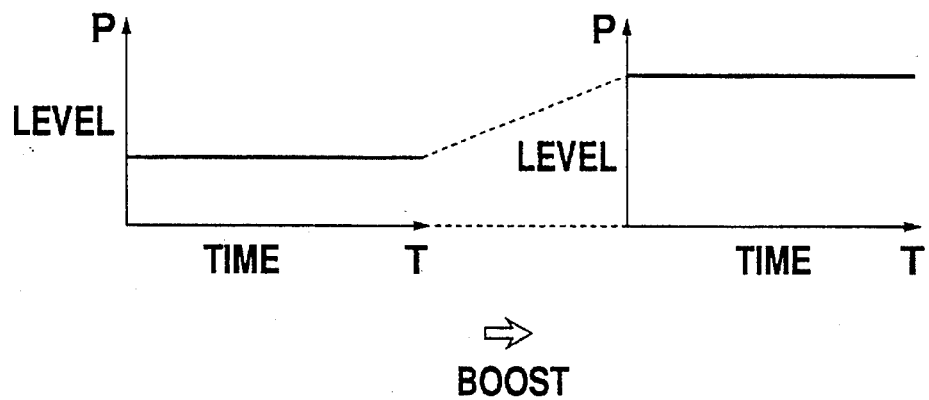
FIG. 6B is a level comparison illustrating the boost effect of the prior art apparatus shown in FIG. 6A.
Figure 7A:
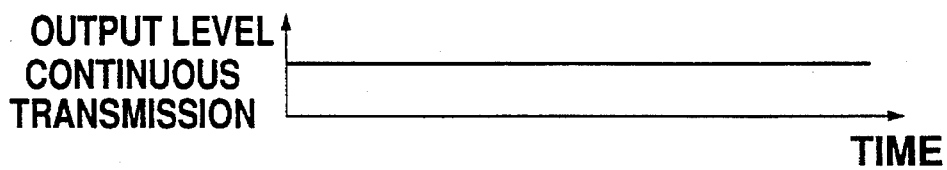
FIG. 7A is a graph showing changes of the continuous transmission level.
Figure 7B:
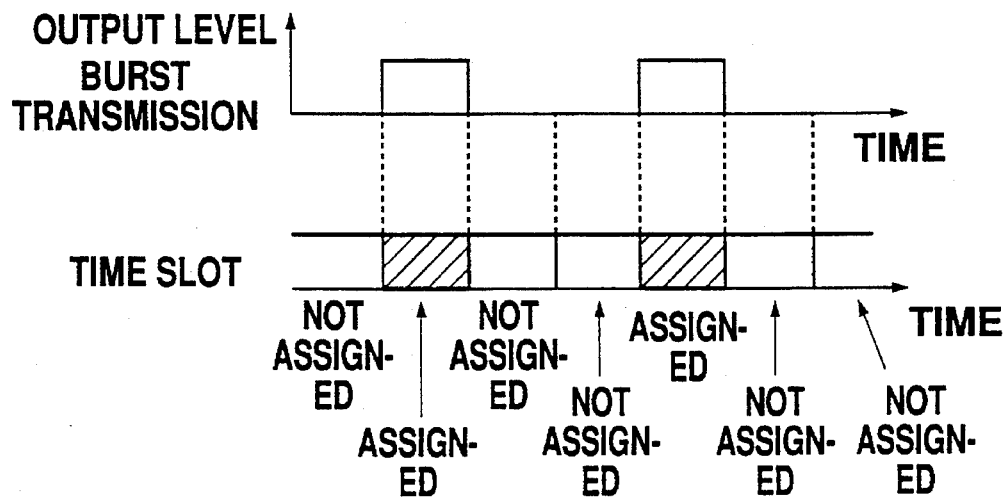
FIG. 7B is a timing chart illustrating the level changes and time slot sequence in the burst transmission.

FIG. 5 illustrates the operation of a burst transmission apparatus relating to the third embodiment of the present invention. The third embodiment can be realized by the same arrangement as in the second embodiment. The third embodiment is characterized by that the low-power transmitter 1 performs the same control as in the continuous transmission while the booster 21 only carries out the burst transmission control (which is the same control as in the second embodiment). Since the control circuit 13 performs the burst transmission control as in the first and second embodiments when the booster 2 is not used, the low-power transmitter 1 can solely carry out the burst transmission.

The third embodiment can provide not only the same advantages as in the second embodiment, but can also simplify the control operation since the control circuit 13 performs the continuous transmission more simply than the burst transmission when the booster 2 is being used.

I claim:

1. A burst transmission booster comprising:
   a power amplifier for power-amplifying transmission signals from a low-power transmitter;
   power amplification control means for controlling the power amplification by the power amplifier such that the power level and waveform of the transmission signals power-amplified by the power amplifier are substantially coincident with those of a given reference burst wave; and
   burst control means responsive to control information from an external means for determining and providing the reference burst wave to the power amplification control means;
   said control information containing information specifying a target power level and a reference burst wave generation timing;
   said burst control means generating a reference burst wave such that the power level of the transmission signal amplified by said power amplifier is controlled to a level equal to said target power level and will rise and fall in amplitude with a timing in synchronism with said reference burst wave generation timing.

2. A booster as defined in claim 1 wherein the control information provided by said external means contains information relating to the leading and trailing edge waveforms of the reference burst wave and wherein the burst control means generates a reference burst wave such that the leading and trailing edge waveforms of the power level of the transmission signal power-amplified by said power amplifier will be those of said information.

3. A booster as defined in claim 1 wherein said burst control means comprises storage means for storing the target power level and reference burst waveform which are correlated with each other and means responsive to the target power level for reading a reference burst waveform corresponding to the target power level from said storage means.

4. A booster as defined in claim 3 wherein the information relating to the burst wave generation timing is provided by generation of an enable signal.

5. A burst transmission system comprising:
   a low-power transmitter responsive to a power level command for power-amplifying and outputting transmission signals; and
   a booster for further power-amplifying the transmission signals power-amplified by the low-power transmitter such that the power level and waveform of the transmission signals are coincident with or substantially coincident with those of a given reference burst wave, said booster being connectable with the low-power transmitter;
   said booster comprising:
      a power amplifier for power-amplifying transmission signals from said low-power transmitter;
      power amplification control means for controlling the power amplification by the power amplifier such that the power level and waveform of the transmission signals power-amplified by the power amplifier are substantially coincident with those of a given reference burst wave; and
      burst control means responsive to control information from an external means for determining and providing the reference burst wave to the power amplification control means;
      said control information containing information specifying a target power level and a reference burst wave generation timing;
      said burst control means generating a reference burst wave such that the power level of the transmission signal amplified by said power amplifier is controlled to a level equal to said target power level and will rise and fall in amplitude with a timing in synchronism with said reference burst wave generation timing.

6. A burst transmission apparatus as defined in claim 5 wherein the control information provided by said external means contains information relating to the leading and trailing edge waveforms of the reference burst wave and wherein the burst control means generates a reference burst wave such that the leading and trailing edge waveforms of the power level of the transmission signal power-amplified by said power amplifier will be those of said information.

7. A burst transmission apparatus as defined in claim 5 wherein said burst control means comprises storage means for storing the target power level and reference burst waveform which are correlated with each other and means responsive to the target power level for reading a reference burst waveform corresponding to the target power level from said storage means.

8. A burst transmission apparatus as defined in claim 6 wherein the information relating to the burst wave generation timing is provided by generation of an enable signal.

9. A burst transmission apparatus as defined in claim 5 wherein the low-power transmitter power-amplifies a burst signal to be transmitted in discontinuous time slots, said amplified burst signal being then outputted to said booster as a transmission signal.

10. A burst transmission apparatus as defined in claim 9 wherein said low-power transmitter is responsive to the information relating to the target power level, the information relating to the burst wave generation timing and the leading and trailing edge waveforms of the burst wave for power-amplifying the burst signal such that the power level of the transmission signal outputted to the booster will be said target power level and give its leading and trailing edge timing a timing in synchronism with the burst wave generation timing.

11. A burst transmission apparatus as defined in claim 5 wherein said low-power transmitter outputs signals to be continuously transmitted with time to said booster as transmission signals.

12. A burst transmission apparatus as defined in claim 5 wherein said booster is connectable to said low-power transmitter and wherein when said booster is not connected to said low-power transmitter, and said low-power transmitter power-amplifies and outputs burst signals to be transmitted in discontinuous time slots.

13. A burst transmission apparatus as defined in claim 11 wherein when said booster is not connected to said low-power transmitter, said low-power transmitter power-amplifies and outputs burst signals.

14. A boosting method comprising the steps of:
a first step of determining a reference burst wave based on external control information; and
a second step of power-amplifying transmission signals from a low-power transmitter such that the power level and waveform of the power-amplified transmission signals will be substantially coincident with those of the determined reference burst wave;
said external control information containing information specifying a target power level and a reference burst wave generation timing;
said first step further including a step of generating a reference burst wave such that the power level of the transmission signal amplified by said power amplifier is controlled to a level equal to said target power level and will rise and fall in amplitude with a timing in synchronism with said reference burst wave generation timing.

15. A boosting method as defined in claim 14 wherein the control information provided by said external means contains information relating to the leading and trailing edge waveforms of the reference burst wave and wherein said first step includes a step of generating a reference burst wave such that the leading and trailing edge waveforms of the power level of the transmission signal power-amplified by said power amplifier will be those of said information.

16. A boosting method as defined in claim 14 wherein the information relating to the burst wave generation timing is provided by generation of an enable signal and wherein said first step includes a step of storing in a storage means the target power level and reference burst waveform which are correlated with each other and a step of being responsive to the target power level for reading a reference burst waveform corresponding to the target power level from said storage means.

* * * * *